(12) United States Patent
Norman

(10) Patent No.: US 6,700,142 B1
(45) Date of Patent: Mar. 2, 2004

(54) SEMICONDUCTOR WAFER ON WHICH IS FABRICATED AN INTEGRATED CIRCUIT INCLUDING AN ARRAY OF DISCRETE FUNCTIONAL MODULES

(75) Inventor: Richard S. Norman, Sutton (CA)

(73) Assignee: Hyperchip Inc., Montreal (CA)

( * ) Notice: Subject to any disclaimer, the term of this patent is extended or adjusted under 35 U.S.C. 154(b) by 0 days.

(21) Appl. No.: 10/330,069

(22) Filed: Dec. 30, 2002

Related U.S. Application Data

(60) Provisional application No. 60/343,164, filed on Dec. 31, 2001.

(51) Int. Cl.[7] .................. H01L 27/10; H01L 21/66; H01L 21/82
(52) U.S. Cl. .................. 257/202; 257/499; 257/528; 257/618; 438/14; 438/128; 438/130
(58) Field of Search .................. 257/48, 202, 208, 257/499, 618, 620; 438/14, 17, 128, 130

(56) References Cited

U.S. PATENT DOCUMENTS

| | | | |
|---|---|---|---|
| 3,795,974 A | | 3/1974 | Calhoun .................. 438/6 |
| 4,956,602 A | * | 9/1990 | Parrish .................. 324/537 |
| 5,138,419 A | * | 8/1992 | Tatematsu .................. 257/723 |
| 5,208,469 A | * | 5/1993 | Hodoshima .................. 257/208 |
| 5,809,225 A | | 9/1998 | Ohsawa et al. .................. 714/32 |
| 6,379,983 B2 | * | 4/2002 | Farnworth .................. 438/15 |

FOREIGN PATENT DOCUMENTS

| | | | |
|---|---|---|---|
| JP | 59092527 A | 5/1984 | .......... H01L/21/66 |
| JP | 04352354 A | 12/1992 | .......... H01L/27/04 |
| JP | 11016971 A | 1/1999 | .......... H01L/21/66 |

* cited by examiner

*Primary Examiner*—T. N. Quach

(57) ABSTRACT

The present invention provides a semiconductor wafer that has a predetermined global functionality and comprises a top surface, a bottom surface and a peripheral edge between the top surface and the bottom surface. An integrated circuit is fabricated on the semiconductor wafer and includes a working set of discrete functional modules arranged into a central rectangular array of rows and columns defined by a boundary that includes four rectilinear sides and four corners. The integrated circuit further includes a spare set of discrete functional modules formed outside the boundary of the working set into at least one line that is disposed along a side of the rectangular array of the working set. If a discrete functional module in the working set is found to be defective, it can be replaced by a discrete functional module in the spare set.

7 Claims, 4 Drawing Sheets

US 6,700,142 B1

SEMICONDUCTOR WAFER ON WHICH IS FABRICATED AN INTEGRATED CIRCUIT INCLUDING AN ARRAY OF DISCRETE FUNCTIONAL MODULES

CROSS-REFERENCE TO RELATED APPLICATION

The above-referenced application is based on U.S. provisional patent application No. 60/343,164, filed on Dec. 31, 2001, having the same inventor.

FIELD OF THE INVENTION

The invention relates to a semiconductor wafer having an integrated circuit that includes a working set of discrete functional modules that are arranged into a rectangular array of rows and columns within a rectilinear boundary, and a spare set of discrete functional modules that are positioned outside the rectilinear boundary of the working set of discrete functional modules such that the discrete functional modules in the spare set may replace one or more defective discrete functional modules in the working set.

BACKGROUND OF THE INVENTION

In the field of wafer scale integration (WSI) and large area integrated circuit (LAIC) manufacturing, it is known to design a complex integrated circuit on a semiconductor wafer such that the semiconductor wafer has a predetermined global functionality. The bulk of potential functionalities require regular arrays of circuitry that together form a complex integrated circuit. Such integrated circuits generally comprise a plurality of discrete functional modules that are formed into a rectangular array of rows and columns. The rectangular array of discrete functional modules is generally positioned in the center of the semiconductor wafer such that the four corners of the array are adjacent the circular periphery of the semiconductor wafer.

During the fabrication of the discrete functional modules of the integrated circuit, some of the discrete functional modules can be formed defective. Therefore, the integrated circuit includes two specific sets of discrete functional modules: a working set of discrete functional modules and a spare set of discrete functional modules that can replace the functionality of defective discrete functional modules in the working set. The discrete functional modules in the spare set generally occupy the outside rows and/or columns of the rectangular array and the discrete functional modules in the working set are generally grouped within the center of the integrated circuit. Alternatively, the discrete functional modules in the spare set can be interspersed with the discrete functional modules in the working set within the rows and columns of the array of the integrated circuit. Either way, the array of functional modules of the integrated circuits formed on semiconductor wafers according to the prior art leaves large crescent shaped regions on the semiconductor wafer unused.

In light of the costs and complexity involved in making semiconductor wafers, there exists a need in the industry for a configuration of discrete functional modules that better utilizes the space available on a semiconductor wafer.

SUMMARY OF THE INVENTION

As embodied and broadly described herein, the present invention provides a semiconductor wafer that has a predetermined global functionality. The semiconductor wafer comprises a body of semiconductor material having a top surface, a bottom surface and a peripheral edge between the top surface and the bottom surface. The semiconductor wafer further includes an integrated circuit fabricated on the body of semiconductor material. The integrated circuit includes a working set of discrete functional modules that are of generally identical dimensions and are arranged into a rectangular array of rows and columns with a discrete functional module at each one of the four corners. The rectangular array has a boundary that includes four rectilinear sides and four corners. A space is defined between each corner of the rectangular array and the peripheral edge of the semiconductor wafer. Each space is insufficient to accommodate a discrete functional module between the corner and the periphery in a rectangular arrangement with the discrete functional module at the corner of the rectangular array. The integrated circuit further includes a spare set of discrete functional modules formed between the boundary of the working set and the peripheral edge of the semiconductor wafer. The discrete functional modules in the spare set are arranged in at least one line that is disposed along at least one rectilinear side of the rectangular array. The length of the line of discrete functional modules is less than a length of one rectilinear side of the rectangular array.

As further embodied and broadly described herein, the present invention provides a method for manufacturing a semiconductor wafer that has a predetermined global functionality. The method comprises fabricating an integrated circuit on a body of semiconductor material that has a top surface, a bottom surface and a peripheral edge between the top surface and the bottom surface. The integrated circuit includes a working set of discrete functional modules that are of generally identical dimensions and are arranged into a rectangular array of rows and columns. The rectangular array has a boundary that includes four corners. The rectangular array has a discrete functional module at each one of its four corners. A space is defined between each corner of the working set and the peripheral edge of the semiconductor wafer. Each space is insufficient to accommodate a discrete functional module between the corner and the periphery in a rectangular arrangement with the discrete functional module at the corner of the rectangular array. The integrated circuit further includes a spare set of discrete functional modules formed between the boundary and the peripheral edge. The method includes testing the discrete functional modules in the working set and if the testing determines that all the discrete functional modules in the working set are operational, then the method involves completing the manufacturing of the semiconductor wafer or configuring the circuitry of the semiconductor wafer such that only the discrete functional modules in the working set provide the predetermined global functionality of the semiconductor wafer. If the testing reveals that one or more discrete functional modules in the working set are defective, then the method involves functionally replacing the defective discrete functional modules in the working set with a corresponding number of discrete functional modules in the spare set to provide the predetermined global functionality.

As a non-limiting, example of implementation, the "completing" step and the "functionally replacing" step may include selectively setting up or negating inter-functional-module connections through techniques well known in the art such as laser programmable anti-fuse, etc., or through electronically enabling or disabling inter-functional-module links.

The advantage of the above-described semiconductor wafer and manufacturing process is that they provide more space for the discrete functional modules in the working set by forming the discrete functional modules in the spare set in an area of a semiconductor wafer that was previously unused. This allows more discrete functional modules to be included in the working set, or alternatively allows the size of the discrete functional modules in the working set to be enlarged so as to provide more space for internal circuitry.

In a specific example of implementation, when all the discrete functional modules in the working set are operational, and signal interconnects are established only between the discrete functional modules in the working set, such that the discrete functional modules in the spare set are unconnected thereby rendering them inoperational, then "completing" the manufacturing of the semiconductor wafer involves carrying out the normal steps required to put the semiconductor wafer into use. Such steps are known in the art and will not be discussed further herein. In other words, nothing is done with the discrete functional modules in the spare set, and they are left unconnected to the functional modules of the working set.

Alternatively, when all the discrete functional modules in the working set are operational, and signal interconnects are established between both the discrete functional modules in the spare set and the discrete functional modules in the working set, then completing the manufacturing of the semiconductor wafer involves the added step of disabling one or more of the signal interconnects with the discrete functional modules in the spare set. In a variant, the discrete functional modules in the spare set can simply be rendered inoperative.

In the instance where some of the discrete functional modules in the working set are defective, and the signal interconnects are established only between the discrete functional modules in the working set, then functionally replacing the spare discrete functional modules in the working set can involve forming signal interconnects with a required number of discrete functional modules in the spare set.

Alternatively, when some of the discrete functional modules in the working set are defective, and signal interconnects are established between both the discrete functional modules in the spare set and the discrete functional modules in the working set, then functionally replacing the discrete functional modules in the working set can involve maintaining, or not disabling, the discrete functional modules in the spare set that are to act as replacements for the defective discrete functional modules in the working set, and only disabling the discrete functional modules in the spare set that are not required. Disabling a discrete functional module can be done by disabling the circuit it contains or the signal interconnects that lead to it, or through numerous other techniques that are known in the art of wafer scale integration and large area integrated circuits.

BRIEF DESCRIPTION OF THE DRAWINGS

A detailed description of examples of implementation of the present invention is provided hereinbelow with reference to the following drawings, in which.

Figure 1:
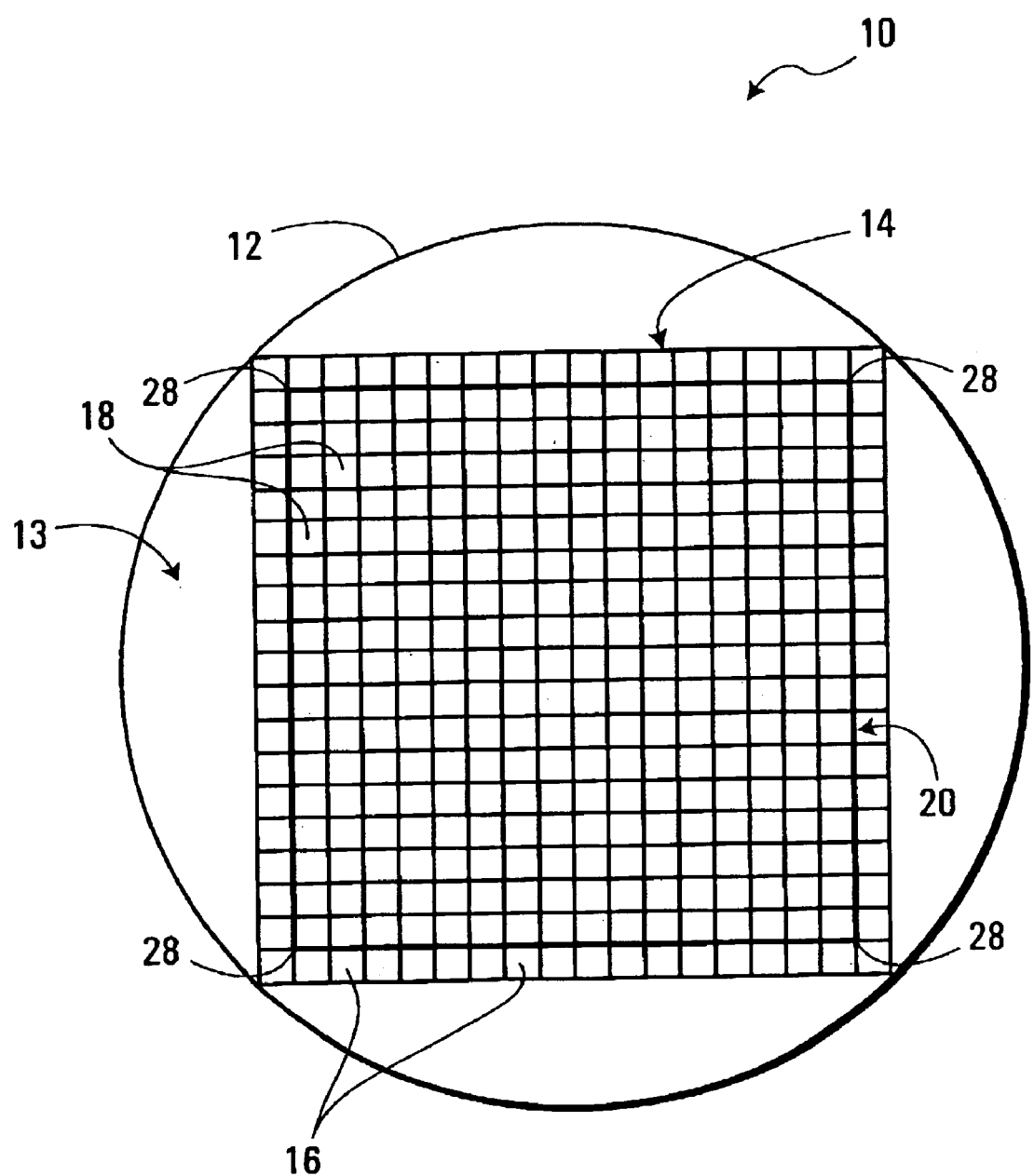
FIG. 1 is a top plan view of a semiconductor wafer including an integrated circuit realized according to the prior art.

In the drawings, embodiments of the invention are illustrated by way of example. It is to be expressly understood that the description and drawings are only for the purposes of illustration and as an aid to understanding, and are not intended to be a definition of the limits of the invention.

DETAILED DESCRIPTION

Shown in FIG. 1 is a top view of a semiconductor wafer 10 according to the prior art. Semiconductor wafer 10 is intended to be used as an operational unit that has a predetermined global functionality. In other words, semiconductor wafer 10 is not intended to be cut into discrete chips that are to be used separately. Semiconductor wafer 10 includes a top surface 13, a bottom surface (not shown) and a circular periphery 12.

An integrated circuit 14 is formed on top surface 13 of semiconductor wafer 10. Integrated circuit 14 has a plurality of discrete functional modules that are arranged into a rectangular array of rows and columns. The discrete functional modules within integrated circuit 14 are divided into two distinct sets: a working set 20 of discrete functional modules 18 that are arranged into a central array of rows and columns, and a spare set of discrete functional modules 16 that are arranged around working set 20. In the specific embodiment shown, integrated circuit 14 is formed as an 18×19 array of columns and rows, and working set 20 is a 16×17 array of columns and rows. Although FIG. 1 shows the discrete functional modules 16 of the spare set grouped outside the array of discrete functional modules 18 of the working set, it is known to have the discrete functional modules 16 of the spare set interspersed with the discrete functional modules 18 of the working set 20 within the rows and columns of the integrated circuit 14.

For the purpose of this specification, unless specifically specified what type of discrete functional module is being discussed, the term "discrete functional module" refers to both discrete functional modules in the spare set and discrete functional modules in the working set.

FIG. 1 shows a thick black line surrounding working set 20 of discrete functional modules 18. The thick black line represents a boundary between discrete functional modules 18 in working set 20 and discrete functional modules 16 in the spare set. In the embodiment shown, the boundary surrounds the array of working set 20 and includes four corners 28. Although FIG. 1 represents the boundary as a thick black line, in reality, the boundary is simply an imaginary divide between the discrete functional modules 18 in working set 20 and the discrete functional modules 16 in the spare set.

The discrete functional modules 18 within working set 20 may have an identical or a different functionality. It is the combined functionality of all the individual discrete functional modules 18 in working set 20 that provides semiconductor wafer 10 with its predetermined global functionality. For each discrete functional module 18 in working set 20 that has a specific functionality, there is at least one discrete functional module 16 in the spare set that has the same functionality. Unless a discrete functional module 16 in the spare set is used to replace the functionality of a discrete functional module 18 in working set 20, the functionality of the discrete functional modules 16 in the spare set does not contribute to the global functionality of semiconductor wafer 10.

It is not essential to have a one-to-one ratio of discrete functional modules 16 in the spare set to discrete functional modules 18 in the working set 20. As can be seen in FIG. 1, working set 20 includes 256 discrete functional modules 18 while there are only 68 discrete functional modules 16 in the spare set. As such, if there are more than 68 defective discrete functional modules 18 in working set 20, then semiconductor wafer 10 will be unable to achieve its predetermined global functionality.

Figure 2:
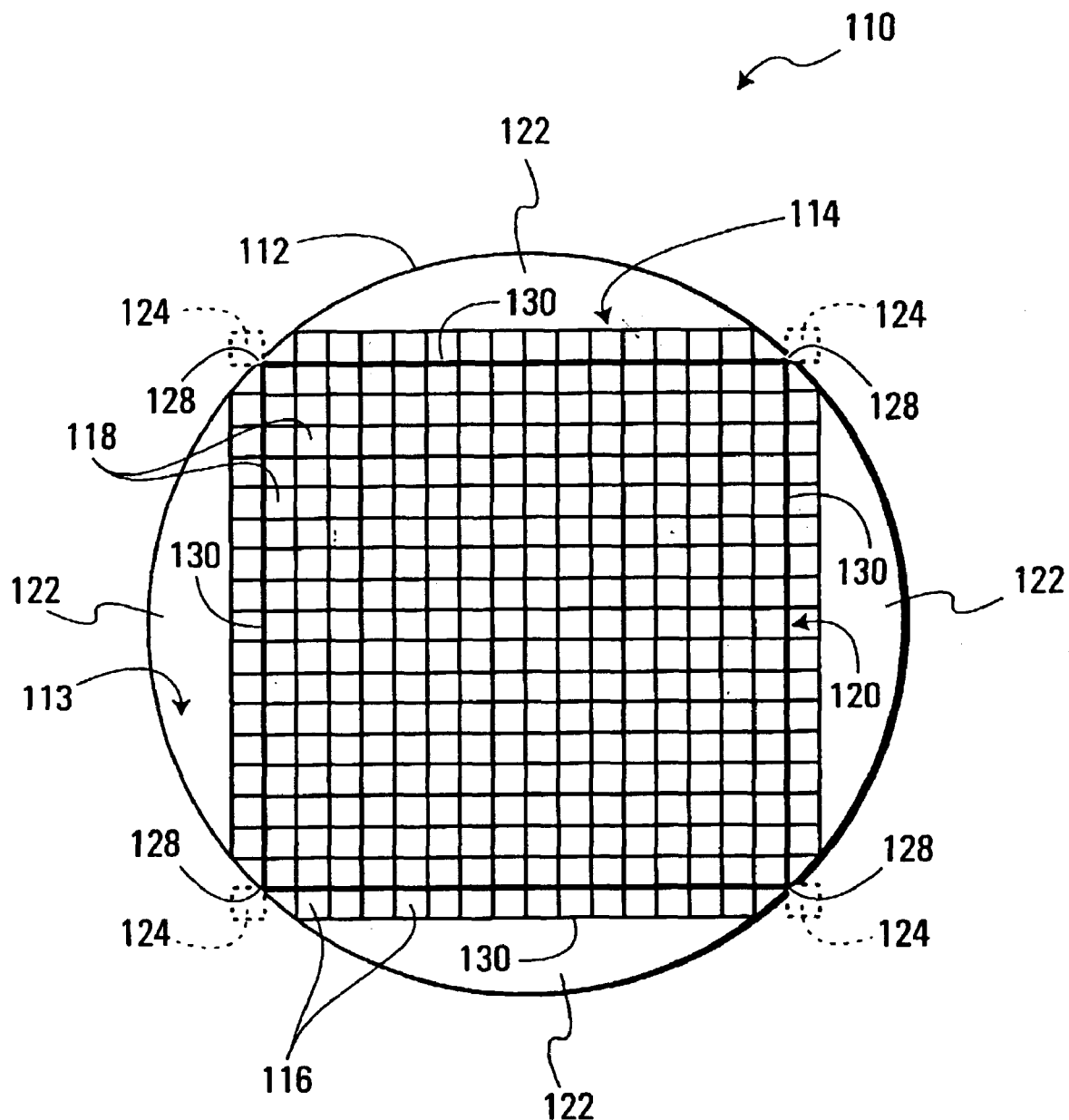
FIG. 2 is a top plan view of a semiconductor wafer according to an example of implementation of the present invention.

Shown in FIG. 2 is a top view of a semiconductor wafer 110 according to an example of implementation of the present invention. Semiconductor wafer 110 is intended to be used as an operational unit that has a predetermined global functionality, meaning that semiconductor wafer 110 is not intended to be cut into discrete chips that are to be used separately. Semiconductor wafer 110 has a top surface 113, a bottom surface (not shown) and a circular periphery 112. In a preferred embodiment, the top surface of semiconductor wafer 110 is planar, however a semiconductor wafer having a non-planar top surface is also within the scope of the invention.

An integrated circuit 114 is formed on surface 113 of semiconductor wafer 110. Integrated circuit 114 comprises a plurality of discrete functional modules that are arranged into a rectangular array of rows and columns. The discrete functional modules within integrated circuit 114 are divided into two distinct sets: a working set 120 of discrete functional modules 118 that are arranged into a central array of rows and columns, and a spare set of discrete functional modules 116 that are arranged around working set 120 within wafer crescents 122. In the embodiment shown, working set 120 is a 16×17 array of columns and rows, and the spare set is formed into two lines of fourteen discrete functional modules 116 and two lines of fifteen discrete functional modules 116.

Figure 3:
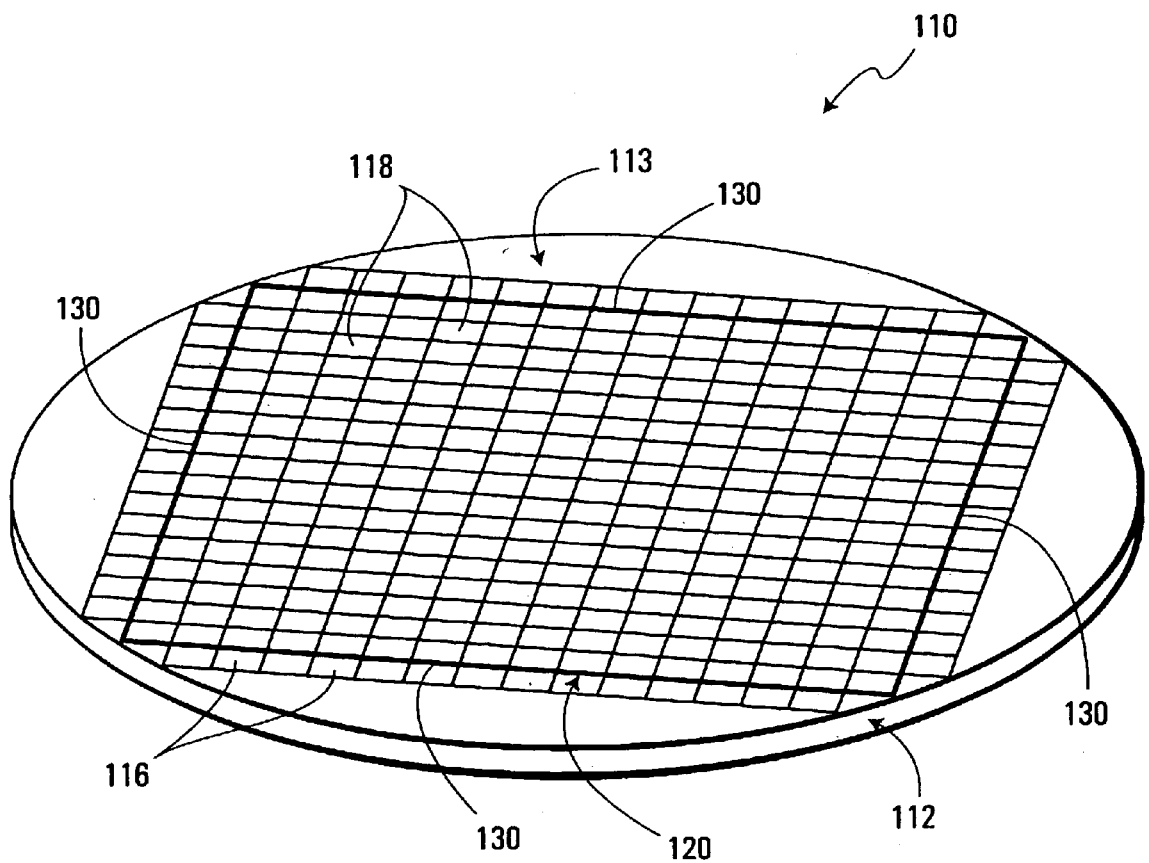
FIG. 3 is a perspective view of the semiconductor wafer of FIG. 2.
Figure 4:
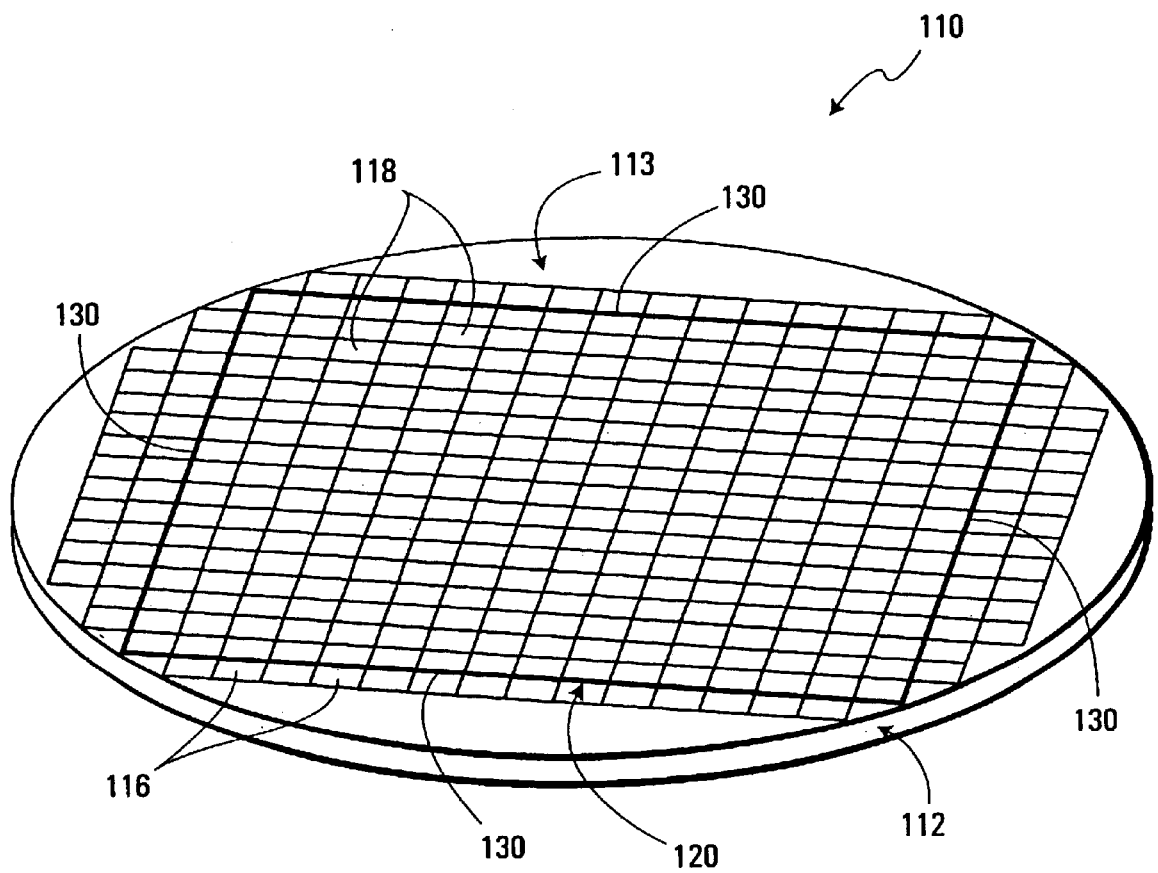
FIG. 4 is a perspective view of the semiconductor wafer of FIG. 3 with an additional two columns of spare functional modules.

Although working set 120 is shown in FIGS. 2, 3 and 4 to be a rectangular array, it is within the scope of the invention for working set 120 to be a perfectly square array. The array of the working set 120 has four corners 128 and four rectilinear sides 130. If working set 120 were a perfectly square array, rectilinear sides 130 would have theoretical maximum lengths of approximately √2/2 times the wafer diameter. In reality, whether working set 120 is a perfectly square array, or whether working set 120 is a rectangular array as shown in FIGS. 2, 3 and 4, the lengths of sides 130 will be slightly less than the maximum theoretical length required for corners 128 to reach periphery 112. This means that there is a space between each corner 128 of working set 120 and circular periphery 112. This space is insufficient to accommodate a discrete functional module in rectangular arrangement with the discrete functional module at the corner 128 of working set 120. A discrete functional module in rectangular arrangement with a discrete functional module 118 at the corner of the working set 120 refers to a discrete functional module that would be located at the corner of working set 120 if working set 120 were to be augmented by an additional row and an additional column. For clarity, the position of a discrete functional module 124 in rectangular arrangement with the discrete functional module at the corner of the array of working set 120 is shown in dotted lines in FIG. 2. It will be appreciated that this position is beyond the periphery of the wafer.

FIG. 2 shows a thick black line surrounding working set 120 of discrete functional modules 118. The thick black line represents a boundary between discrete functional modules 118 in working set 120 and discrete functional modules 116 in the spare set. In the embodiment shown, the boundary is a square having four rectilinear sides and four corners which are the same rectilinear sides 130 and corners 128 of working set 120. Although, FIG. 2 represents the boundary as a thick black line, in reality, the boundary is simply an imaginary divide between discrete functional modules 118 in working set 120 and discrete functional modules 116 in the spare set.

Initially, integrated circuit 114 is formed as an 18×19 array of functional modules, wherein the discrete functional modules at the corners of the array do not fit on the surface of semiconductor wafer 110. As such, the spare set of discrete functional modules 116 are arranged into two lines of fourteen discrete functional modules 116 and two lines of fifteen discrete functional modules 116 that are disposed along the rectilinear sides 130 of working set 120, and that are formed within the wafer crescents 122. As can be seen in FIG. 2, each of the four lines of discrete functional modules 116 has a length that is less than the length of the rectilinear sides 130 of working set 120. Although FIG. 2 illustrates one line of discrete functional modules 116 positioned in each of the four wafer crescents 122, it is within the scope of the invention for the spare set of discrete functional modules 116 to have a line of discrete functional modules in only one, two or three of wafer crescents 122. In addition, it is within the scope of the invention for each line of discrete functional modules 116 to contain any number of discrete functional modules that will fit within wafer crescents 122. As can be seen in FIG. 4, it is also possible to have more than one line of spare functional modules 116 within each wafer crescent 122. FIG. 4 shows two lines of spare cells 116 within two opposing wafer crescents 122.

As can be seen in both FIGS. 3 and 4, both discrete functional modules 118 in working set 120 and discrete functional modules 116 in the spare set are of substantially the same size.

The discrete functional modules 118 in working set 120 may have an identical or a different functionality. It is the combined functionality of all the individual discrete functional modules 118 in working set 120 that provides semiconductor wafer 110 with its predetermined global functionality. For example, there may be four types of discrete functional modules 118 in working set 120 that each have a different functionality. For each type of discrete functional module 118 in working set 120 that has a specific functionality, there is at least one discrete functional module 116 in the spare set that has the same functionality. In addition, it is possible that if there is one type of discrete functional module 118 in working set 120 that has a particularly complex functionality and is prone to a high rate of defectiveness, then it is preferable that most of the discrete functional modules 116 in the spare set have that same functionality.

It should be understood that it is not essential to have a one-to-one ratio of discrete functional modules 116 in the spare set to discrete functional modules 118 in the working set 120. It is possible to have a discrete functional module 116 in the spare set for every discrete functional module 118 in working set 120, however, this is not always practical. Therefore, it is within the scope of the invention to have fewer discrete functional modules 116 in the spare set than discrete functional modules 118 in the working set 120.

As can be seen in FIG. 2, working set 120 includes 256 discrete functional modules 118, while there are only 56 discrete functional modules 116 in the spare set. As such, if there are more than 56 defective discrete functional modules 118 in working set 120, then semiconductor wafer 110 will be unable to achieve its predetermined global functionality.

During manufacturing of wafer 110, each individual discrete functional module within integrated circuit 114 is tested in order to determine if any defective discrete functional modules exist, and if so, to determine where the defective discrete functional modules are located within integrated circuit 114. The testing is done according to known techniques that will not be described further.

If the testing determines that all discrete functional modules 118 in working set 120 are operational, then the manufacturing of semiconductor wafer 110 or the configuring of the circuitry contained on semiconductor wafer 110 is completed such that only the functionality of the discrete functional modules 118 in working set 120 contribute to the predetermined global functionality of semiconductor wafer 110.

Completing the manufacturing of semiconductor wafer 110 may involve several options depending on how the signal interconnects are realized on semiconductor wafer 110. Under a first possibility, when all discrete functional modules 118 in working set 120 are operational (none is defective) and prior to the testing procedure the signal interconnects are made only for the discrete functional modules 118 in working set 120, then the predetermined global functionality of semiconductor wafer 110 is available without the need to create additional signal interconnects on semiconductor wafer 110. In such cases, the discrete functional modules 116 in the spare set are left unconnected, thereby rendering them in operational. Under this possibility, completing the manufacture of semiconductor wafer 110 involves carrying out the normal steps required to put the semiconductor wafer 110 into use. Some non-limiting examples of such steps include connecting semiconductor wafer 110 to external devices, packaging semiconductor wafer 110, etc.

Under a second possibility, all discrete functional modules 118 in working set 120 are operational (none is defective) and, prior to the testing procedure, signal interconnects have been made for both discrete functional modules 118 in working set 120 and discrete functional modules 116 in the spare set. In this case, completing the manufacture of semiconductor wafer 110 involves the added step of disabling one or more of the discrete functional modules 116 in the spare set. Disabling one or more of the discrete functional modules 116 in the spare set includes the case where all discrete functional modules 116 in the spare set are disabled. This can be done either by disabling the signal interconnects for those discrete functional modules 116 or disabling the discrete functional modules 116 themselves. The disabling of signal interconnects can include physically disconnecting inter-functional-module links through techniques that are well known in the art such as laser programmable anti-fuse, etc., or through electrically disabling the inter-module links.

In the instances where the testing of the discrete functional modules within integrated circuit 114 reveals the presence of defective discrete functional modules 118 in working set 120, the method of manufacturing semiconductor wafer 110 involves functionally replacing the defective discrete functional modules 118 in working set 120 with a corresponding number of discrete functional modules 116 in the spare set to provide the predetermined global functionality of semiconductor wafer 110.

Functionally replacing a discrete functional module with another discrete functional module may involve several options depending on how signal interconnects have been made prior to the testing procedure. Under a first possibility, when working set 120 includes defective discrete functional modules 118 and, prior to the testing procedure, signal interconnects are made only for the discrete functional modules 114 in working set 120, then functionally replacing one discrete functional module by another discrete functional module involves forming new signal interconnects or electrically enabling the electrical inter-functional-module links for the discrete functional modules 116 in the spare set whose functionality is required. The fabrication of the new signal interconnects is done according to known techniques that will not be described.

Under a second possibility, when working set 120 includes defective discrete functional modules 118 and, prior to the testing procedure, signal interconnects are formed for both discrete functional modules 118 in working set 120 and discrete functional modules 116 in the spare set, then functionally replacing the discrete functional modules 118 in the working set involves disabling only the signal interconnects for the discrete functional modules 116 in the spare set that are not required. This can be done either by disabling the signal interconnects for those discrete functional modules 116 or disabling the discrete functional modules 116 themselves. This can include physically disconnecting inter-functional-module links through techniques well known in the art such as laser programmable anti-fuse, etc., or through electrically disabling the inter-module links.

When functionally replacing one discrete functional module by another, a selection of one discrete functional module 116 in the spare set is made from a plurality of discrete functional modules 116 in the spare set. The selection involves two criteria. The first criterion is that the selected discrete functional module 116 should provide the same functionality as the defective discrete functional module 118. The second criterion is the distance between the defective discrete functional module and its replacement. The shortest possible distance is desirable which simplifies the creation of signal interconnects.

Although various embodiments have been illustrated, this was for the purpose of describing, but not limiting, the invention. Various modifications will become apparent to those skilled in the art and are within the scope of this invention, which is defined more particularly by the attached claims.

I claim:

1. A method for manufacturing a semiconductor wafer having a predetermined global functionality, comprising:
   a) fabricating an integrated circuit on a body of semiconductor material having a top surface, a bottom surface and a peripheral edge between said top surface and said bottom surface, said integrated circuit including:
      i) a working set of discrete functional modules, the discrete functional modules in said working set being of generally identical dimensions and being arranged into a rectangular array of rows and columns, said rectangular array having a boundary including four corners, said rectangular array having a discrete functional module at each one of said four corners;
      ii) a space being defined between each corner and said peripheral edge, each space being insufficient to accommodate a discrete functional module between the corner and the periphery in a rectangular arrangement with the discrete functional module at the corner of said rectangular array;
      iii) a spare set of discrete functional modules formed between said boundary and said peripheral edge;
   b) testing the discrete functional modules in said working set;

c) if the testing determines that all the discrete functional modules in said working set are operational, then completing the manufacturing of said semiconductor wafer such that only the discrete functional modules in said working set provide said predetermined global functionality; and d) if the testing reveals that one or more discrete functional modules in said working set are defective, then functionally replacing the defective discrete functional modules in said working set with a corresponding number of discrete functional modules in said spare set to provide said predetermined global functionality.

2. A method as defined in claim 1, wherein the completing of the manufacture of said semiconductor wafer includes disabling one or more of, the discrete functional modules in said spare set.

3. A method as defined in claim 1, including the step of for each defective discrete functional module in said working set selecting a discrete functional module among a plurality of discrete functional modules in said spare set, the selecting being effected at least partly on a basis of a distance between the defective discrete functional module and the individual discrete functional modules in the plurality of discrete functional modules in said spare set.

4. A method as defined in claim 3, including the step of realizing signal interconnects for a discrete functional module in said spare set selected as a replacement for a defective discrete functional module in said working set.

5. A semiconductor wafer having a predetermined global functionality, comprising:

a) a body of semiconductor material having a top surface, a bottom surface and a peripheral edge between said top surface and said bottom surface;

b) an integrated circuit fabricated on said body of semiconductor material, said integrated circuit including:

i) a working set of discrete functional modules, the discrete functional modules in said working set being of generally identical dimensions and being arranged into a rectangular array of rows and columns, said rectangular array having a boundary including four rectilinear sides and four corners, said rectangular array having a discrete functional module at each one of said four corners;

ii) a space being defined between each corner and said peripheral edge, each space being insufficient to accommodate a discrete functional module between the corner and the periphery in a rectangular arrangement with the discrete functional module at the corner of said rectangular array; and iii) a spare set of discrete functional modules formed between said boundary and said peripheral edge, the discrete functional modules in said spare set being arranged in at least one line disposed along at least one rectilinear side of said rectangular array, the length of said line being less than a length of said one rectilinear side.

6. A semiconductor wafer as defined in claim 5, wherein the global functionality of said semiconductor wafer is provided solely by said working set of discrete functional modules, and each discrete functional module in said spare set is in operational.

7. A semiconductor wafer as defined in claim 5, wherein said working set has at least one defective discrete functional module and said spare set has a discrete functional module functionally replacing said defective discrete functional module.

* * * * *